United States Patent [19]
Narita

[11] Patent Number: 5,859,451
[45] Date of Patent: Jan. 12, 1999

[54] SEMICONDUCTOR MEMORY HAVING STORAGE CAPACITOR CONNECTED TO DIFFUSION REGION THROUGH BARRIER LAYER

[75] Inventor: Kaoru Narita, Tokyo, Japan

[73] Assignee: NEC Corporation, Tokyo, Japan

[21] Appl. No.: 717,601

[22] Filed: Jun. 19, 1991

[30] Foreign Application Priority Data

Jun. 19, 1990 [JP] Japan .................................. 2-160192

[51] Int. Cl.⁶ ..................... H01L 27/108; H01L 29/76; H01L 29/94
[52] U.S. Cl. ..................... 257/306; 257/296; 257/301; 257/304; 257/305; 257/311; 257/411
[58] Field of Search ................. 357/23.5, 23.6, 357/51; 257/296, 298, 300, 301, 303, 304, 305, 306, 311, 411

[56] References Cited

U.S. PATENT DOCUMENTS

| | | | |
|---|---|---|---|
| 4,845,539 | 7/1989 | Inoue | 257/304 |
| 4,897,709 | 1/1990 | Yokoyama et al. | |
| 4,967,248 | 10/1990 | Shimizu | 257/305 |
| 4,969,022 | 11/1990 | Nishimoto et al. | 257/301 |
| 4,985,718 | 1/1991 | Ishijima | 357/23.6 |
| 5,005,103 | 4/1991 | Kwon et al. | 361/313 |
| 5,006,481 | 4/1991 | Chan et al. | 437/52 |
| 5,006,910 | 4/1991 | Taguchi | 357/23.6 |
| 5,010,379 | 4/1991 | Ishil | 357/23.6 |
| 5,017,982 | 5/1991 | Kobayashi | 357/23.6 |
| 5,049,975 | 9/1991 | Ajika | 357/71 |
| 5,091,761 | 2/1992 | Hiraiwa et al. | 257/306 |

FOREIGN PATENT DOCUMENTS

| | | |
|---|---|---|
| 0315422 | 5/1989 | European Pat. Off. . |
| 1183152 | 7/1989 | Japan . |
| 1243460 | 9/1989 | Japan . |

OTHER PUBLICATIONS

European Search Report.
Solar Cells, vol. 27, Nos. 1–4, Oct.–Dec. 1989, pp. 177–189, M.–A. Nicolet et al., "Issues in Metal/Semiconductor Contact Design and Implementation", pp. 180, 181.

*Primary Examiner*—Sara W. Crane
*Assistant Examiner*—Valencia M. Wallace
*Attorney, Agent, or Firm*—Sughrue, Mion, Zinn, Macpeak & Seas

[57] ABSTRACT

A memory cell comprising a MOSFET formed on a principle surface of a semiconductor substrate and an information storage capacitor having a storage electrode formed in or on the substrate so as to contact with a drain region of the MOSFET, and a capacitor electrode formed adjacent to the storage electrode with a capacitor insulator film being sandwiched between the storage electrode and the capacitor electrode. The storage electrode is connected to the drain region of the MOSFET through a thin barrier layer which is formed between the drain region and the storage electrode region so as to prevent impurities in the storage electrode from being diffused into the drain region.

4 Claims, 2 Drawing Sheets

SEMICONDUCTOR MEMORY HAVING STORAGE CAPACITOR CONNECTED TO DIFFUSION REGION THROUGH BARRIER LAYER

BACKGROUND OF THE INVENTION

1. Field of the invention

The present invention relates to a one-transistor type memory cell for use in DRAMs (dynamic random access memory), and more specifically to such a one-transistor type memory cell having an associated information storage capacitor.

2. Description of related art

In the prior art, a one-transistor type memory cell having an associated information storage capacitor such as a stacked capacitor has been known, which includes a MOSFET (metal-oxide-semiconductor field effect transistor) formed in a device formation zone confined by a field oxide on a principle surface of a semiconductor substrate. The MOSFET includes a pair of diffusion regions which are formed in the principle surface of the semiconductor substrate, separately from each other so as to form a channel between the pair of diffusion regions. The pair of diffusion regions constitute a source region and a drain region of the MOSFET. An oxide layer is formed to cover the principle surface of the semiconductor substrate within the device formation zone, and a word line is formed on the oxide layer so as to pass above the channel formed between the source region and the drain region. Therefore, a portion of the word line passing above the channel formed between the source region and the drain region functions as a gate electrode, and a portion of the oxide layer between the gate electrode and the channel functions as a gate oxide.

The gate electrode and the oxide layer which is not covered with the gate electrode, are covered with a lower interlayer insulator layer. An opening is formed in the lower interlayer insulator layer at a position of the drain region, and a storage electrode is formed to extend over the lower interlayer insulator layer and to contact with the drain region in the opening formed in the lower interlayer insulator layer. A capacitor electrode is formed over the storage electrode with a capacitor insulator film being sandwiched between the storage electrode and the capacitor electrode. Thus, a stacked capacitor is formed of the storage electrode, the capacitor insulator and the capacitor electrode.

In addition, an upper interlayer insulator layer is formed to cover the stacked capacitor, and a bit line is formed on the upper interlayer insulator layer. This bit line is connected to the source region through a contact hole formed in the upper and lower interlayer insulator layer above the source region.

Thus, the one-transistor type memory cell connected to the word line and the bit line is formed. In this one-transistor type memory cell, the storage electrode is ordinarily formed of a polysilicon. In order to cause the storage electrode to have sufficient conductivity, the polysilicon of the storage electrode has been diffused with impurities. In this diffusion process, the impurities diffuse not only into the storage electrode but also into the semiconductor substrate. As a result, another diffusion region has been inevitably formed within the drain region in the semiconductor substrate. This second diffusion region has a depth larger than that of the drain region. In other words, the second diffusion region extends into the semiconductor substrate beyond a bottom of the drain region.

Formation of the above mentioned second diffusion region has given significant adverse affects. First, the impurities diffused into the semiconductor substrate will lower a threshold voltage of a parasitic transistor formed in proximity of the field oxide, so that a device isolation function is deteriorated. In addition, a threshold of a transistor connected to the word line is also decreased. This influence becomes further remarkable if a memory capacity is increased and a cell size is reduced. Therefore, the formation of the second diffusion region is inconvenient to microminiaturization of semiconductor memories.

In view of the above problems, concentration of the impurities diffused to the storage electrode of the stacked capacitor has been restrained to a low level in the prior art.

SUMMARY OF THE INVENTION

Accordingly, it is an object of the present invention to provide a one-transistor type memory cell having an associated information storage capacitor, which has overcome the above mentioned defect of the conventional one.

Another object of the present invention is to provide a one-transistor type memory cell having an associated information storage capacitor, in which diffusion of impurities from a storage electrode of the associated information storage capacitor to a source/drain diffusion region of the transistor is effectively suppressed or prevented.

The above and other objects of the present invention are achieved in accordance with the present invention by a memory cell comprising a semiconductor substrate and a MOSFET formed on a principle surface of the semiconductor substrate. This MOSFET includes first and second diffusion regions which are formed in the principle surface of the semiconductor substrate, separately from each other so as to form a channel between the first and second diffusion regions. The MOSFET also includes an oxide layer formed to cover the principle surface of the semiconductor substrate above the channel, and a gate electrode formed on the oxide layer above the channel. The memory cell also comprises a capacitor having a storage electrode formed to contact with the first diffusion region, and a capacitor electrode formed adjacent to the storage electrode with a capacitor insulator film being sandwiched between the storage electrode and the capacitor electrode. The storage electrode is connected to the first diffusion region through a thin barrier layer which is formed between the first diffusion region and the storage electrode region so as to prevent impurities in the storage electrode from being diffused into the semiconductor substrate.

Preferably, the thin barrier layer is formed of a silicon nitride, a silicon oxide, or a titanium nitride. In this case, the thin barrier layer is made to have a sufficiently thin thickness to ensure electric connection between the first diffusion region of the MOSFET and the storage electrode region of the associated capacitor.

The above and other objects, features and advantages of the present invention will be apparent from the following description of preferred embodiments of the invention with reference to the accompanying drawings.

DESCRIPTION OF THE PREFERRED EMBODIMENTS

Figure 1:
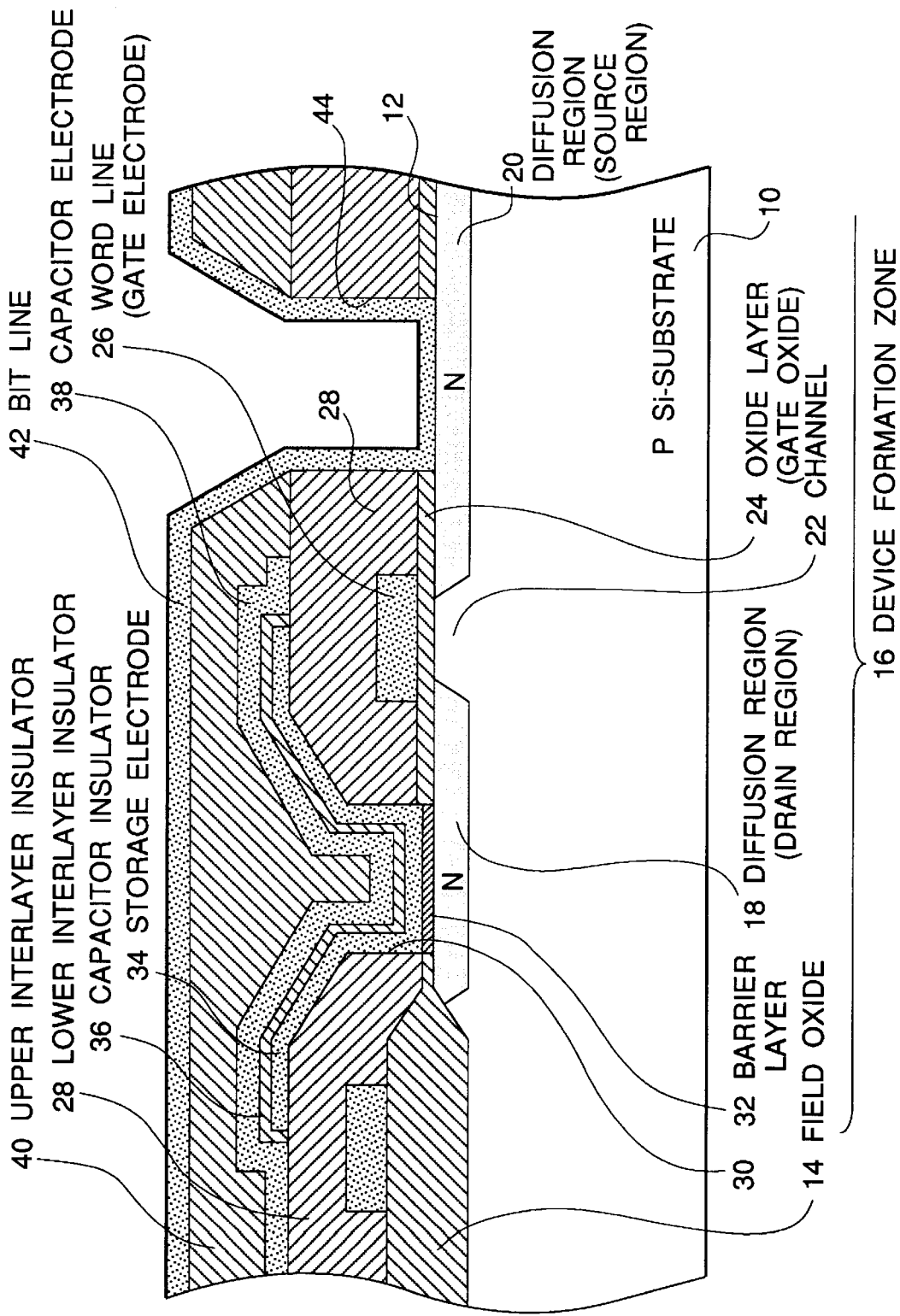
FIG. 1 is a diagrammatic sectional view of a first embodiment of the memory cell in accordance with the present invention, including a stacked capacitor.

Referring to FIG. 1, there is shown a diagrammatic sectional view of a first embodiment of the memory cell in accordance with the present invention.

The shown memory cell is of a one-transistor type including a stacked capacitor. The shown memory cell includes a P-type silicon substrate 10 having a principal surface 12, which is an upper surface in the drawing. The principle surface 12 of the semiconductor substrate 10 is divided into a number of device formation zones confined by a field oxide 14, which is formed in a LOCOS (local oxidation of silicon) method. Only one of the device formation zones is shown in FIG. 1 for simplification of the drawing, and is generally designated by Reference Numeral 16.

Within the device formation zone 16, a pair of N-type diffusion regions 18 and 20 are formed in the principle surface 12 of the semiconductor substrate, separately from each other so as to form a channel 22 between the pair of diffusion regions 18 and 20. An oxide layer 24 is formed to cover the principle surface of a semiconductor substrate within the device formation zone 16, and a word line 26 formed of polysilicon is located on the oxide layer 24 to pass above the channel 22. Thus, the pair of diffusion regions 18 and 20 constitute a drain region and a source region of a MOSFET, respectively. A portion of the word line 26 passing above the channel 22 functions as a gate electrode of the MOSFET, and a portion of the oxide layer 24 above the channel 22 functions as a gate oxide. Preferably, the pair of N-type diffusion regions 18 and 20 are formed in self-alignment with the gate electrode 26, for example by an ion implantation using the gate electrode 26 as a mask.

The gate electrode 26 and the oxide layer 24 which is not covered with the gate electrode 26, are covered with a lower interlayer insulator layer 28. An opening 30 is formed to pierce through the lower interlayer insulator layer 28 and the oxide layer 24 at a position of the drain region 18, and a barrier layer 32 is formed on an exposed upper surface of the drain region 18 within the opening 30. A storage electrode 34 formed of a polysilicon layer having a thickness of 2000 Å is deposited over the lower interlayer insulator layer 28 to extend to a position directly above the gate oxide 26 on the one hand and to a position above the field oxide 28 on the other hand. This storage electrode 34 is in contact with the barrier layer 32 in the opening 30 formed in the lower interlayer insulator layer 28.

In addition, a capacitor insulator film 36 is formed to completely cover the storage electrode 34, and a capacitor electrode 38 formed of a polysilicon layer is deposited to completely cover the capacitor insulator film 36, so that the capacitor insulator film 36 is sandwiched between the storage electrode 34 and the capacitor electrode 38. Thus, a stacked capacitor is formed of the storage electrode 34, the capacitor insulator 36 and the capacitor electrode 38.

In addition, an upper interlayer insulator layer 40 is formed to completely cover the stacked capacitor and the lower interlayer insulator layer 28, and a bit line 42 formed of for example tungsten silicide is located on the upper interlayer insulator layer 40. This bit line 42 is connected to the source region 20 through a contact hole 44 which is formed to pierce through the upper and lower interlayer insulator layers 40 and 28 above the source region 20.

Thus, the one-transistor type memory cell connected to the word line and the bit line is formed.

The barrier layer 32 is formed of, for example, a silicon nitride layer having a thickness of 40 Å, which can be formed by a thermal nitridation in which the substrate is heated in an atmosphere of $NH_3$ after the opening 30 is formed to pierce through the lower interlayer insulator layer 28 and the oxide layer 24 so as to expose an upper surface of the drain region 18 within the opening 30.

Interposition of the barrier layer 32 between the drain region 18 and the storage electrode 34 prevents diffusion of impurities into the P-type silicon substrate 10, even if impurity, for example, phosphorus is sufficiently diffused into the storage electrode 34 until the storage electrode 34 has a sheet resistance of 20 $\Omega/\square$. On the other hand, the thickness of 40 Å in the silicon nitride barrier layer 32 ensures sufficient electrical connection between the drain region 18 and the storage electrode 34.

The barrier layer 32 can be formed of not only the silicon nitride but also any material such as a silicon oxide or a titanium nitride, that not only functions as a barrier against impurity diffusion but also ensures electrical connection between the drain region 18 and the storage electrode 34.

Figure 2:
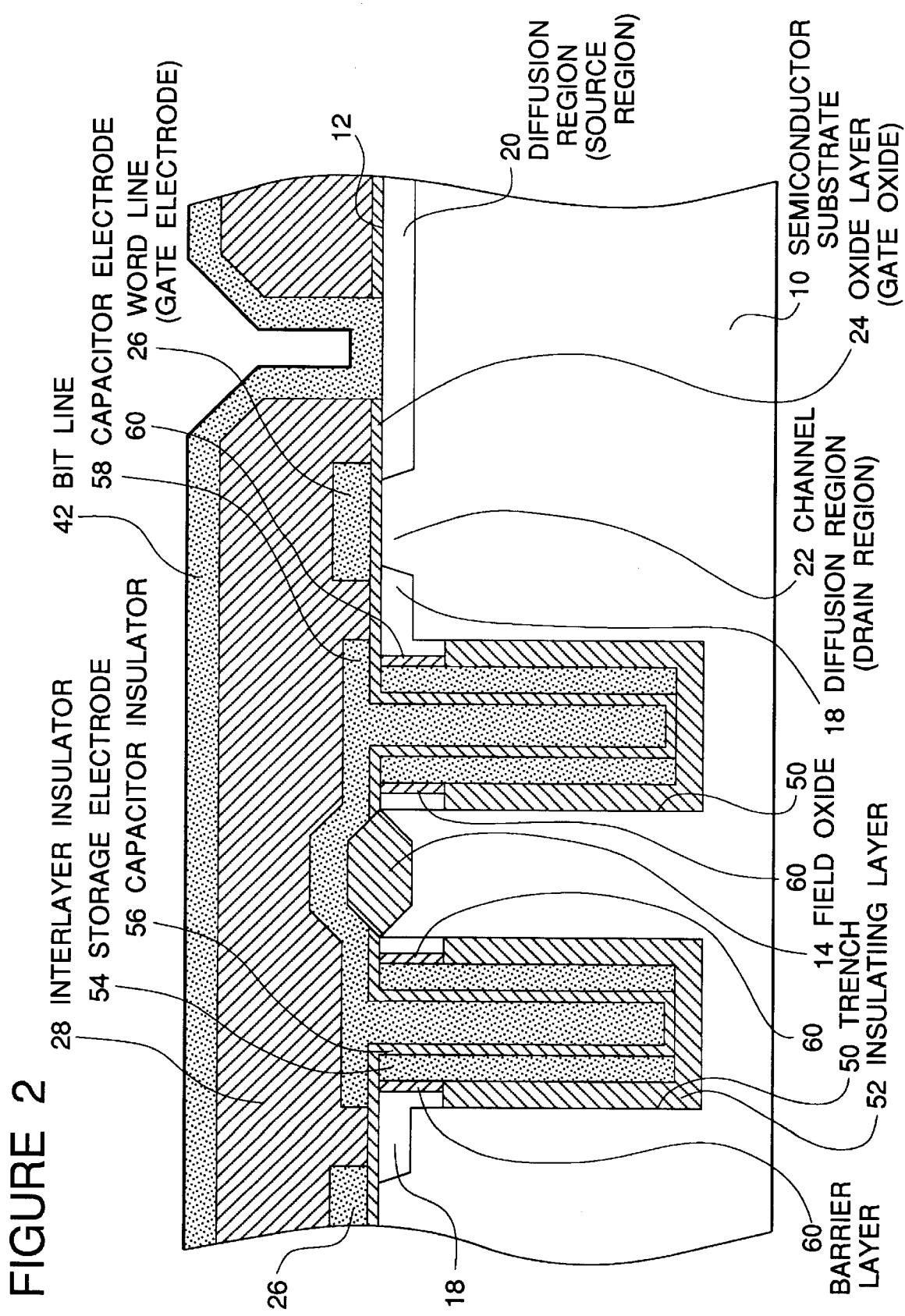
FIG. 2 is a diagrammatic sectional view of a second embodiment of the memory cell in accordance with the present invention, including a trench capacitor.

Referring to FIG. 2, there is shown a diagrammatic sectional view of a second embodiment of the memory cell in accordance with the present invention. The shown memory cell is of a one-transistor type including including a trench capacitor. In FIG. 2, elements corresponding or similar to those shown in FIG. 1 are given the same Reference Numerals, and explanation thereof will be omitted for simplification of explanation.

As seen from FIG. 2, a vertical trench 50 is formed between the field oxide 14 and the drain region 18 of the MOSFET. Inner side and bottom surfaces of the trench 50 are covered with an insulating layer 52. A side surface of the insulating layer 52 is covered with a polysilicon storage electrode 54. In addition, a bottom surface of the insulating layer 52 and an inner side surface and a top surface of the polysilicon storage electrode 54 are completely coated with a capacitor insulator film 56, and an inner space defined by the capacitor insulator film 56 is filled with a polysilicon capacitor electrode 58, which further extends over a top portion of the capacitor insulator film 56 and the field oxide 14. Thus, a capacitor formed of the storage electrode 54, the capacitor insulator film 56 and the capacitor electrode 58, is formed in the vertical trench 50. In the capacitor thus formed in the vertical trench 50, the insulating layer 52 formed on the inner side and bottom surfaces of the trench 50 functions to prevent electric charges accumulated in the storage electrode 54 from being escaped into the substrate 10.

In addition, a barrier layer 60 is formed to extend around and along an upper edge portion of the trench 50, so that the polysilicon storage electrode 54 is connected through the barrier layer 60 to the drain region 18 and the semiconductor substrate under the field oxide 14 is isolated from the polysilicon storage electrode 54 by the barrier layer 60. This barrier layer 60 serves to prevent impurities included in the storage electrode 54 from being diffused into the semiconductor substrate 10 under the field oxide 14. Therefore, adjacent storage electrodes are prevented from being short-circuited to each other by impurities diffused from the adjacent storage electrodes. This means that it is possible to diffuse a sufficient concentration of impurities into the storage electrodes, and therefore, it is possible to further microminiaturize the memory cell.

As seen from the above description of the embodiments with reference to the accompanying drawings, formation of the barrier layer between the diffusion region of the MOSFET and the storage electrode of the capacitor prevents diffusion of impurities from the storage electrode into the semiconductor substrate and/or the diffusion region of the MOSFET. Therefore, it is possible to sufficiently diffuse impurities into the storage electrode of the capacitor, without lowering a threshold voltage of a parasitic transistor formed in proximity of the field oxide, and without lowering the threshold of the transistor connected to the word line. As a result, distance between the field oxide, the storage electrode of the capacitor and the transistor can be reduced. Accordingly, this is very effective for microminiaturization of the memory cell for the speed-up and the increase of integration density of the semiconductor memory.

The invention has thus been shown and described with reference to the specific embodiments. However, it should be noted that the present invention is in no way limited to the details of the illustrated structures but changes and modifications may be made within the scope of the appended claims.

I claim:

1. A memory cell comprising:

a semiconductor substrate;

a MOSFET including first and second diffusion regions which are formed in a principal surface of said semiconductor substrate, separately from each other so as to form a channel between said first and second diffusion regions, said MOSFET also including an oxide layer formed to cover said principal surface of said semiconductor substrate above said channel, and a gate electrode formed on said oxide layer above said channel; and a capacitor having a storage electrode formed to contact with said first diffusion region, and a capacitor electrode formed on said storage electrode with a capacitor insulator film being sandwiched between said storage electrode and said capacitor electrode, said storage electrode being formed of an impurity doped polysilicon, said storage electrode being spaced from and connected to said first diffusion region by a thin barrier layer which is formed between said first diffusion region and said storage electrode, said thin barrier layer being formed of a single thin film composed of a material selected from the group consisting of silicon nitride and silicon oxide, said thin barrier layer not only preventing impurities in said impurity doped polysilicon of said storage electrode from being diffused into said semiconductor substrate, but also ensuring electrical connection between said first diffusion region and said storage electrode.

2. A memory cell claimed in claim 1 wherein said barrier layer is formed of a silicon nitride layer having a thickness of 40 Å, and said storage electrode is formed of polysilicon doped with impurities.

3. A memory cell claimed in claim 1 further including a lower interlayer insulator layer formed to cover said gate electrode and said oxide layer which is not covered with said gate electrode, an opening formed to pierce through said lower interlayer insulator layer and said oxide layer at a position of said first diffusion region, and wherein said barrier layer is formed on a surface of said first diffusion region within said opening, and said storage electrode is deposited over said lower interlayer insulator layer so that said storage electrode is in contact with said barrier layer in said opening formed in said lower interlayer insulator layer, and wherein said capacitor insulator film is formed to completely cover said storage electrode, and said capacitor electrode is deposited to completely cover said capacitor insulator film, so that said capacitor insulator film is sandwiched between said storage electrode and said capacitor electrode.

4. A memory cell claimed in claim 1, further comprising a field oxide layer formed on said semiconductor substrate, and a vertical trench formed between said field oxide layer and said first diffusion region of said MOSFET, said vertical trench having side and bottom surfaces covered with a U-shaped insulating layer, and wherein said storage electrode is formed to cover an inner side surface of said U-shaped insulating layer in said trench, and a portion of bottom surface of said U-shaped insulating layer and an inner side surface and a top surface of said storage electrode are completely coated with said capacitor insulator film, an inner space of said vertical trench defined by said capacitor insulator film being filled with said capacitor electrode, so that a capacitor formed of said storage electrode, said capacitor insulator film and said capacitor electrode is formed in said vertical trench, and said barrier layer is formed to extend around and along an upper edge portion of said trench, so that said storage electrode is connected through said barrier layer to said first diffusion region and said semiconductor substrate under said oxide layer is isolated from said storage electrode by said barrier layer.

* * * * *